(12) United States Patent
Fujita et al.

(10) Patent No.: US 8,383,250 B2
(45) Date of Patent: Feb. 26, 2013

(54) LIGHT-EMITTING ELEMENT, LIGHT-EMITTING APPARATUS, DISPLAY APPARATUS, AND ELECTRONIC DEVICE

(75) Inventors: Tetsuji Fujita, Chino (JP); Hidetoshi Yamamoto, Suwa (JP); Etsuo Mitsuhashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 407 days.

(21) Appl. No.: 12/725,945

(22) Filed: Mar. 17, 2010

(65) Prior Publication Data
US 2010/0244679 A1 Sep. 30, 2010

(30) Foreign Application Priority Data
Mar. 26, 2009 (JP) ................................. 2009-077818

(51) Int. Cl.
*H01L 51/54* (2006.01)
(52) U.S. Cl. ........ 428/690; 428/917; 313/504; 313/506; 257/40
(58) Field of Classification Search .................. None
See application file for complete search history.

(56) References Cited

U.S. PATENT DOCUMENTS

| | | | |
|---|---|---|---|
| 7,854,998 B2 | 12/2010 | Nagara et al. | |
| 7,960,912 B2 * | 6/2011 | Yasukawa et al. | 313/506 |
| 2006/0158104 A1 * | 7/2006 | Iijima et al. | 313/504 |
| 2006/0227079 A1 | 10/2006 | Kashiwabara | |
| 2007/0200124 A1 * | 8/2007 | Suzuri et al. | 257/89 |
| 2007/0241676 A1 * | 10/2007 | Park et al. | 313/506 |
| 2009/0079335 A1 * | 3/2009 | Mitsuya et al. | 313/504 |
| 2010/0230688 A1 * | 9/2010 | Mitsuya et al. | 257/89 |

FOREIGN PATENT DOCUMENTS

| | | |
|---|---|---|
| JP | A-2005-100921 | 4/2005 |
| JP | A-2007-299645 | 11/2007 |
| WO | WO 2005/117499 A1 | 12/2005 |

* cited by examiner

*Primary Examiner* — Dawn L. Garrett
(74) *Attorney, Agent, or Firm* — Oliff & Berridge, PLC

(57) ABSTRACT

A light-emitting element includes a cathode, an anode, a red-light-emitting layer that is disposed between the cathode and the anode and emits red light, a blue-light-emitting layer that is disposed between the red-light-emitting layer and the cathode and emits blue light, a green-light-emitting layer that is disposed between the blue-light-emitting layer and the cathode and emits green light, and an intermediate layer that is disposed between and in contact with the red-light-emitting layer and the blue-light-emitting layer and functions so as to control the transfer of positive holes and electrons between the red-light-emitting layer and the blue-light-emitting layer, wherein the intermediate layer contains a first material and a second material different from the first material, the red-light-emitting layer contains a material of the same type as the first material, and each of the blue-light-emitting layer and the green-light-emitting layer contains a material of the same type as the second material.

12 Claims, 6 Drawing Sheets

LIGHT-EMITTING ELEMENT, LIGHT-EMITTING APPARATUS, DISPLAY APPARATUS, AND ELECTRONIC DEVICE

BACKGROUND

1. Technical Field

The present invention relates to a light-emitting element, a light-emitting apparatus, a display apparatus, and an electronic device.

2. Related Art

Organic electroluminescent elements (organic EL elements) are light-emitting elements that include at least one organic light-emitting layer between an anode and a cathode. Upon the application of an electric field between the cathode and the anode, electrons in the cathode and positive holes in the anode are transferred to the light-emitting layer and recombine with each other in the light-emitting layer, generating excitons. When excitons return to the ground state, excitons release the excitation energy as light.

One example of such light-emitting elements includes three light-emitting layers corresponding to red (R), green (G), and blue (B) between a cathode and an anode and emits white light (see, for example, JP-A-2005-100921). Such a white-light-emitting element can be used in combination with a red (R), green (G), or blue (B) color filter in each pixel to display full-color images.

A light-emitting element according to JPA-2005-100921 further includes an intermediate layer formed of a hole-transport material between light-emitting layers. The intermediate layer functions to restrict electron transfer from one light-emitting layer on the cathode side to another light-emitting layer on the anode side. The light-emitting element can therefore emit white light at a predetermined driving voltage.

However, with a small electric current between the cathode and the anode, balance is lost between the three light-emitting layers of the light-emitting element according to JP-A-2005-100921, and the three light-emitting layers consequently cannot emit white light. With a top emission structure, since light is extracted utilizing optical resonance, white light within a light-emitting element can be extracted substantially as red, green, and blue light. However, white light having an irregular waveform produces red, green, and blue light having an irregular waveform, displaying undesired colors.

For example, although the light-emitting element according to JP-A-2005-100921 can slightly emit light even with a weak current such as a dark current, the color of light is different from white. Thus, a display apparatus that includes this light-emitting element has a reduced contrast (poor black reproduction).

SUMMARY

An advantage of some aspects of the invention is that it provides a light-emitting element that can emit white light even with a small electric current, and a reliable light-emitting apparatus, display apparatus, and electronic device each including the light-emitting element.

Such aspects of the invention can be achieved as described below.

A light-emitting element according to one aspect of the invention includes a cathode, an anode, a red-light-emitting layer that is disposed between the cathode and the anode and emits red light, a blue-light-emitting layer that is disposed between the red-light-emitting layer and the cathode and emits blue light, a green-light-emitting layer that is disposed between the blue-light-emitting layer and the cathode and emits green light, and an intermediate layer that is disposed between and in contact with the red-light-emitting layer and the blue-light-emitting layer and functions so as to control the transfer of positive holes and electrons between the red-light-emitting layer and the blue-light-emitting layer. The intermediate layer contains a first material and a second material different from the first material. The red-light-emitting layer contains a material of the same type as the first material. Each of the blue-light-emitting layer and the green-light-emitting layer contains a material of the same type as the second material.

The intermediate layer can appropriately restrict electron transfer from the blue-light-emitting layer to the red-light-emitting layer and at the same time promote electron transfer from the green-light-emitting layer to the blue-light-emitting layer and from the blue-light-emitting layer to the intermediate layer as well as hole transport from the red-light-emitting layer to the intermediate layer.

Thus, a light-emitting element according to this aspect of the invention can emit white light even with a small electric current.

It is preferable that the first material is a benzidine derivative and that the second material is an anthracene derivative.

This can promote electron transfer from the green-light-emitting layer to the blue-light-emitting layer and from the blue-light-emitting layer to the intermediate layer as well as hole transport from the red-light-emitting layer to the intermediate layer.

It is preferable that the red-light-emitting layer contains a guest material and a host material to which the guest material is added, the guest material being a red-light-emitting material that emits red light, and that the first material is different from the guest material and the host material of the red-light-emitting layer.

This allows the intermediate layer to contain as the first material a material that can appropriately restrict electron transfer from the blue-light-emitting layer to the red-light-emitting layer and allows the red-light-emitting layer to emit light efficiently.

It is preferable that the guest material of the red-light-emitting layer is a dibenzo{[f,f']-4,4',7,7'-tetraphenyl}diindeno{1,2,3-cd:1',2',3'-lm}perylene derivative and that the host material of the red-light-emitting layer is a tetracene derivative.

This can provide high luminous efficacy of the red-light-emitting layer.

It is preferable that the blue-light-emitting layer contains a guest material and a host material to which the guest material is added, the guest material being a blue-light-emitting material that emits blue light, and that the second material is a material of the same type as the host material of the blue-light-emitting layer.

This can promote electron transfer from the blue-light-emitting layer to the intermediate layer and allows the blue-light-emitting layer to emit light efficiently.

It is preferable that the green-light-emitting layer contains a guest material and a host material to which the guest material is added, the guest material being a green-light-emitting material that emits green light, and that the second material is a material of the same type as the host material of the green-light-emitting layer.

This can promote electron transfer from the green-light-emitting layer to the blue-light-emitting layer and allows the green-light-emitting layer to emit light efficiently.

It is preferable that a light-emitting element according to an aspect of the invention further includes a hole-transport layer having a hole-transport ability, the hole-transport layer being in contact with a surface of the red-light-emitting layer opposite the intermediate layer, wherein the hole-transport layer contains a material of the same type as the first material.

This can promote hole transport from the hole-transport layer to the red-light-emitting layer.

It is preferable that the intermediate layer is mainly formed of a mixture of the first material and the second material.

Such an intermediate layer can appropriately restrict electron transfer from the blue-light-emitting layer to the red-light-emitting layer and at the same time promote electron transfer from the green-light-emitting layer to the blue-light-emitting layer and from the blue-light-emitting layer to the intermediate layer as well as hole transport from the red-light-emitting layer to the intermediate layer.

It is preferable that the intermediate layer includes a first sublayer and a second sublayer, the first sublayer being in contact with the red-light-emitting layer and mainly formed of the first material, the second sublayer being disposed between and in contact with the first sublayer and the blue-light-emitting layer and mainly formed of the second material.

Such an intermediate layer can appropriately restrict electron transfer from the blue-light-emitting layer to the red-light-emitting layer and at the same time promote electron transfer from the green-light-emitting layer to the blue-light-emitting layer and from the blue-light-emitting layer to the intermediate layer as well as hole transport from the red-light-emitting layer to the intermediate layer.

In addition, such an intermediate layer can reduce electrons accumulating in the vicinity of the interface between the intermediate layer and the blue-light-emitting layer. This can prevent the degradation and deterioration of the blue-light-emitting layer, extending the life of the light-emitting element.

A light-emitting apparatus according to an aspect of the invention includes a light-emitting element according to an aspect of the invention.

This can provide a reliable light-emitting apparatus.

A display apparatus according to an aspect of the invention includes a light-emitting element according to an aspect of the invention.

This can provide a reliable display apparatus that can display high-contrast images.

An electronic device according to an aspect of the invention includes a display apparatus according to an aspect of the invention.

This can provide a reliable electronic device that can display high-contrast images.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of a light-emitting element, a light-emitting apparatus, a display apparatus, and an electronic device according to the invention will be described below with reference to the accompanying drawings.

First Embodiment

Figure 1:
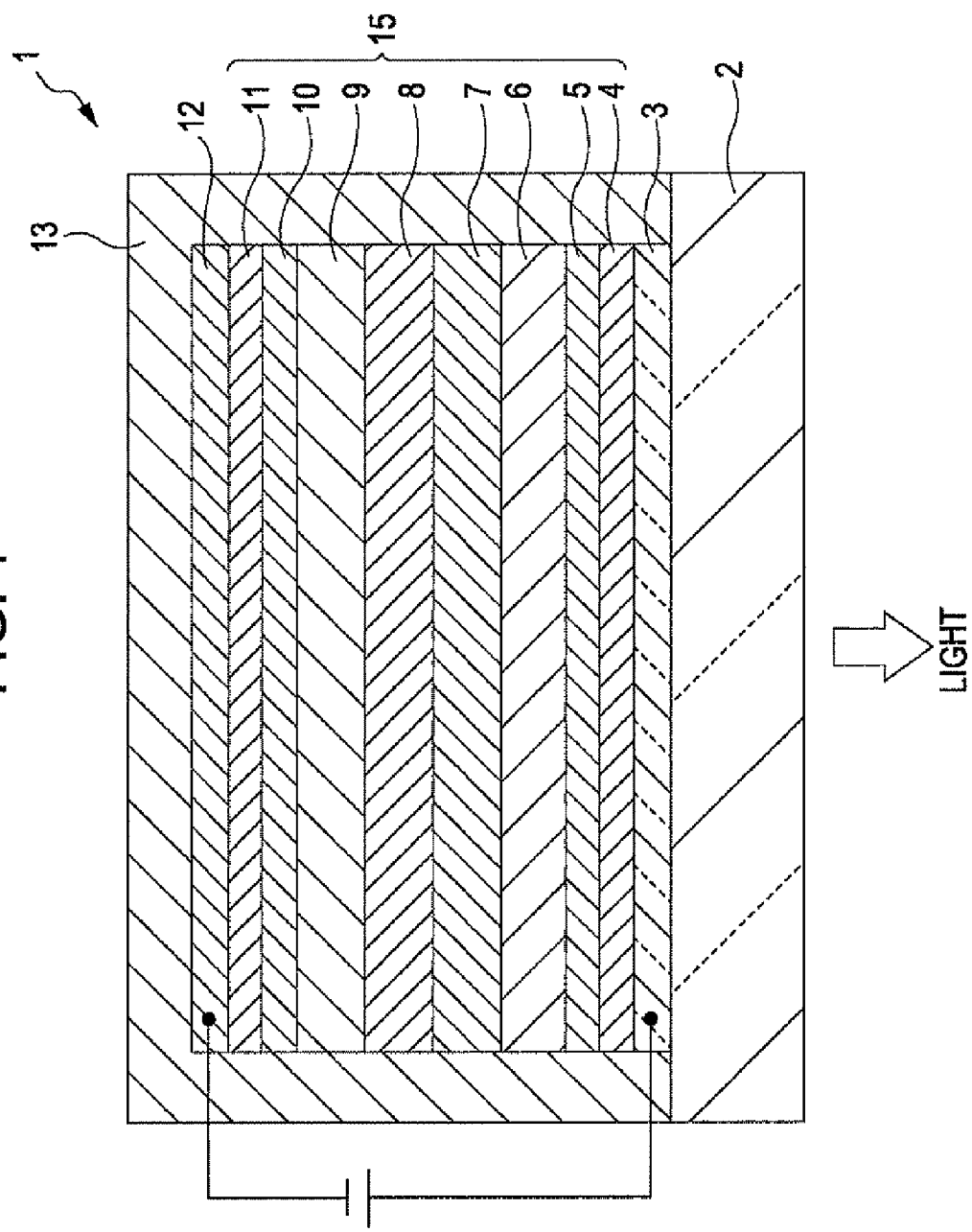
FIG. 1 is a schematic longitudinal sectional view of a light-emitting element according to a first embodiment of the invention.

FIG. 1 is a schematic longitudinal sectional view of a light-emitting element according to a first embodiment of the invention. For convenience of explanation, the top and bottom in FIG. 1 are considered as the "top" and "bottom" of the light-emitting element, respectively.

A light-emitting element (electroluminescent element) 1 illustrated in FIG. 1 emits white light composed of red (R), green (G), and blue (B) light.

The light-emitting element 1 includes an anode 3, a hole-injection layer 4, a hole-transport layer 5, a red-light-emitting layer (a first light-emitting layer) 6, an intermediate layer 7, a blue-light-emitting layer (a second light-emitting layer) 8, a green-light-emitting layer (a third light-emitting layer) 9, an electron-transfer layer 10, an electron-injection layer 11, and a cathode 12 layered in this order.

In other words, the light-emitting element 1 includes a laminate 15 between two electrodes (the anode 3 and the cathode 12). The laminate 15 includes the hole-injection layer 4, the hole-transport layer 5, the red-light-emitting layer 6, the intermediate layer 7, the blue-light-emitting layer 8, the green-light-emitting layer 9, the electron-transfer layer 10, and the electron-injection layer 11 layered from the anode 3 to the cathode 12.

The light-emitting element 1 further includes a substrate 2 at the bottom and a sealing member 13.

The red-light-emitting layer 6, the blue-light-emitting layer 8, and the green-light-emitting layer 9 are supplied (injected) with electrons from the cathode 12 and positive holes from the anode 3. In these light-emitting layers 6, 8, and 9, positive holes and electrons are recombined with each other to release recombination energy, generating excitons. Excitons release (emit) energy (fluorescence or phosphorescence)

while returning to the ground state. The light-emitting element 1 thereby emits white light.

The substrate 2 supports the anode 3. Since the light-emitting element 1 according to the present embodiment emits light from the substrate 2 (a bottom emission structure), the substrate 2 and the anode 3 are substantially transparent (colorless and transparent, or colored transparent or translucent).

The substrate 2 may be formed of a resin material, such as poly(ethylene terephthalate), poly(ethylene naphthalate), polypropylene, a cycloolefin polymer, polyimide, polyethersulfone, poly(methyl methacrylate), polycarbonate, or polyarylate, a glass material, such as quartz glass or soda-lime glass, or a combination thereof.

The average thickness of the substrate 2 is preferably, but not limited to, approximately in the range of 0.1 to 30 mm, more preferably approximately in the range of 0.1 to 10 mm.

When the light-emitting element 1 emits light from the side opposite the substrate 2 (a top emission structure), the substrate 2 may be formed of either a transparent substrate or an opaque substrate.

Examples of the opaque substrate include substrates formed of ceramic materials, such as alumina, substrates formed of metals, such as stainless steel, having an oxide film (insulating film) thereon, and substrates formed of resin materials.

The components of the light-emitting element 1 will be individually described below.

Anode

The anode 3 injects positive holes into the hole-transport layer 5 through the hole-injection layer 4 described below. Preferably, the anode 3 is formed of an electroconductive material having a high work function.

Examples of the material of the anode 3 include oxides, such as indium tin oxide (ITO), indium zinc oxide (IZO), $In_2O_3$, $SnO_2$, $SnO_2$ containing Sb, and ZnO containing Al; Au, Pt, Ag, Cu, and alloys thereof. These materials may be used alone or in combination.

The average thickness of the anode 3 is preferably, but not limited to, approximately in the range of 10 to 200 nm, more preferably approximately in the range of 50 to 150 nm.

Cathode

The cathode 12 injects electrons into the electron-transfer layer 10 through the electron-injection layer 11 described below. Preferably, the cathode 12 is formed of a material having a low work function.

Examples of the material of the cathode 12 include Li, Mg, Ca, Sr, La, Ce, Er, Eu, Sc, Y, Yb, Ag, Cu, Al, Cs, Rb, and alloys thereof. These materials may be used alone or in combination (for example, as a laminate).

Preferred examples of the alloys include alloys of stable metallic elements, such as Ag, Al, and Cu, more specifically, MgAg, AlLi, and CuLi. The cathode 12 formed of such an alloy exhibits improved electron injection efficiency and stability.

The average thickness of the cathode 12 is preferably, but not limited to, approximately in the range of 100 to 1000 nm, more preferably approximately in the range of 100 to 500 nm.

Since the light-emitting element 1 according to the present embodiment has a bottom emission structure, the cathode 12 may be opaque.

Hole-Injection Layer

The hole-injection layer 4 functions to improve the efficiency of hole injection from the anode 3.

The material (hole-injecting material) of the hole-injection layer 4 may be, but not limited to, an amine compound, such as a compound having the following formula 1 (N,N,N',N'-tetraphenyl-p-diaminobenzene) or a derivative thereof, or a combination thereof.

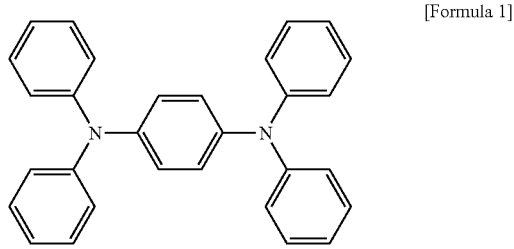 [SMILES: c1ccc(N(c2ccccc2)c2ccc(N(c3ccccc3)c3ccccc3)cc2)cc1]

[Formula 1]

Examples of the derivative of the compound having the formula 1 include compounds having the following formulae 2 to 10.

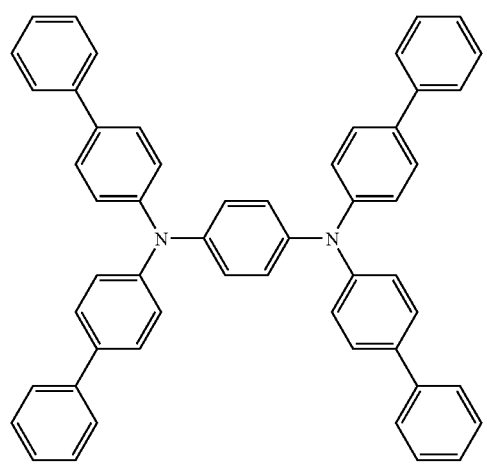

[Formula 2]

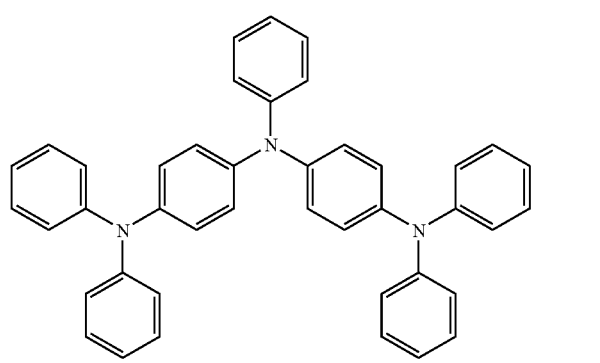

[Formula 3]

-continued
[Formula 4]
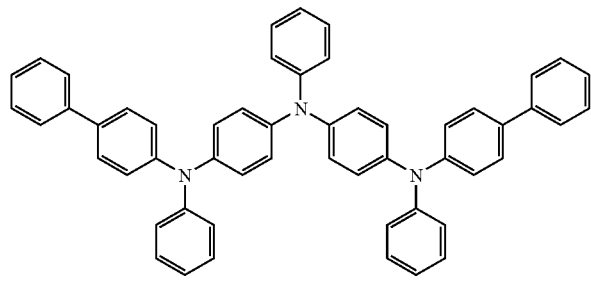
[Formula 5]
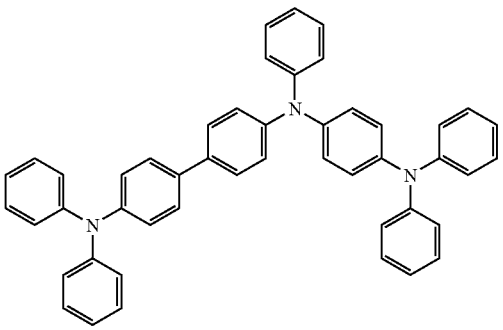
[Formula 6]
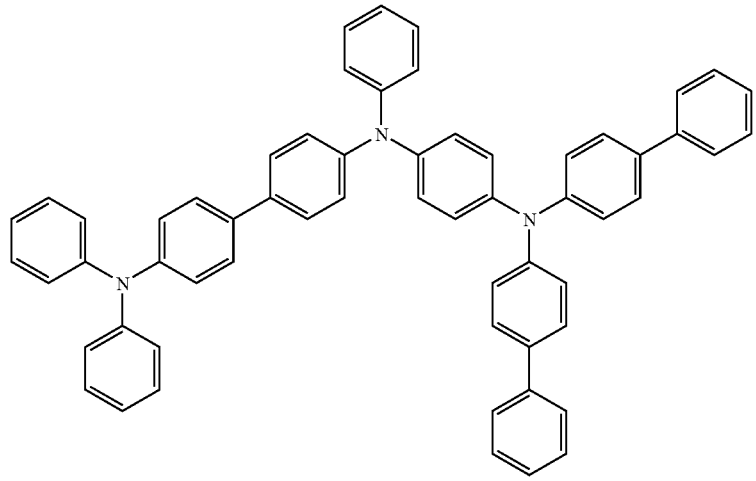
[Formula 7]
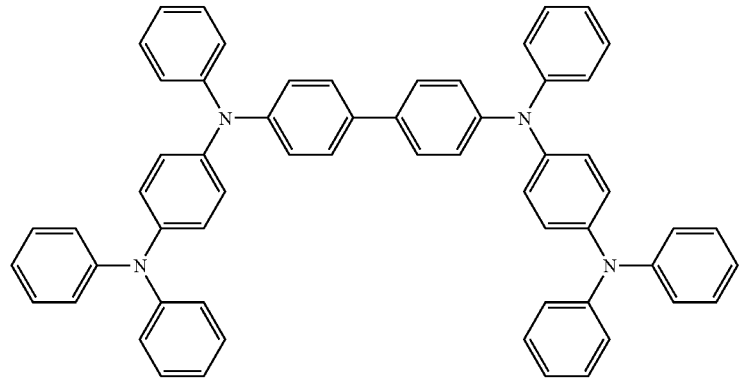
[Formula 8]
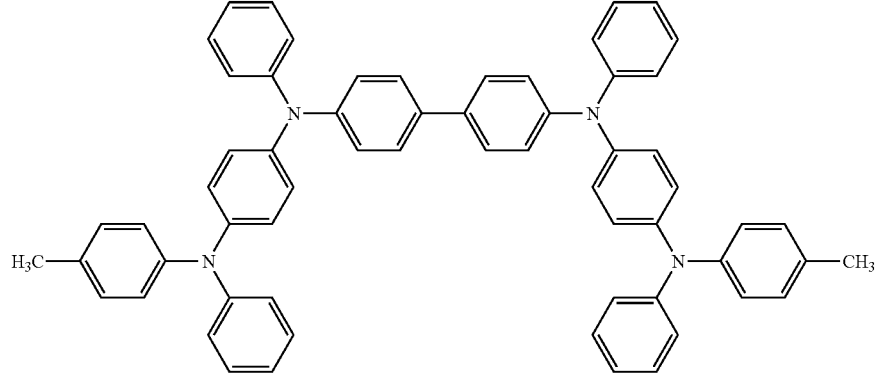

[Formula 9]

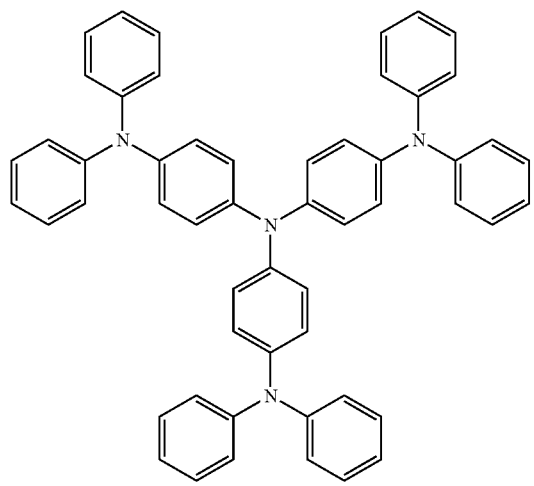

[Formula 10]

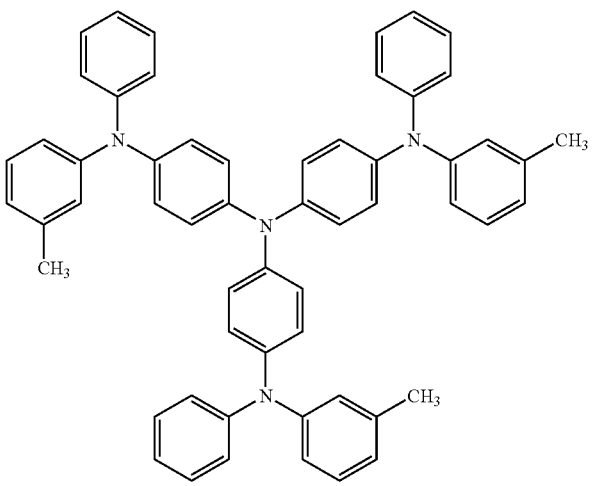

The average thickness of the hole-injection layer 4 is preferably, but not limited to, approximately in the range of 5 to 150 nm, more preferably approximately in the range of 10 to 100 nm.

Either the hole-injection layer 4 or the hole-transport layer 5 described below may be omitted.

Hole-Transport Layer

The hole-transport layer 5 has a function (a hole-transport ability) of transporting positive holes, injected from the anode 3 through the hole-injection layer 4, to the red-light-emitting layer 6.

The hole-transport layer 5 is in contact with a surface of the red-light-emitting layer 6 opposite the intermediate layer 7.

The material of the hole-transport layer 5 may be, but not limited to, an amine compound, such as a compound having the following formula 11 (N,N,N',N'-tetraphenylbenzidine) or a derivative thereof, or a combination thereof.

[Formula 11]

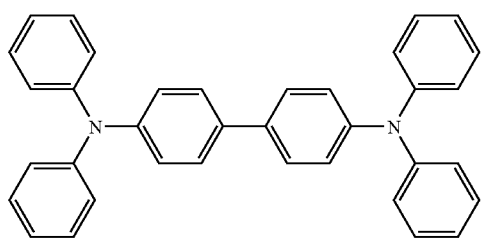

[Formula 12]

[Formula 13]

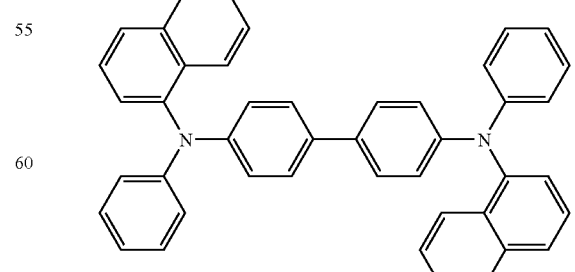

Examples of the derivative of the compound having the formula 11 include compounds having the following formulae 12 to 16.

-continued

[Formula 14]

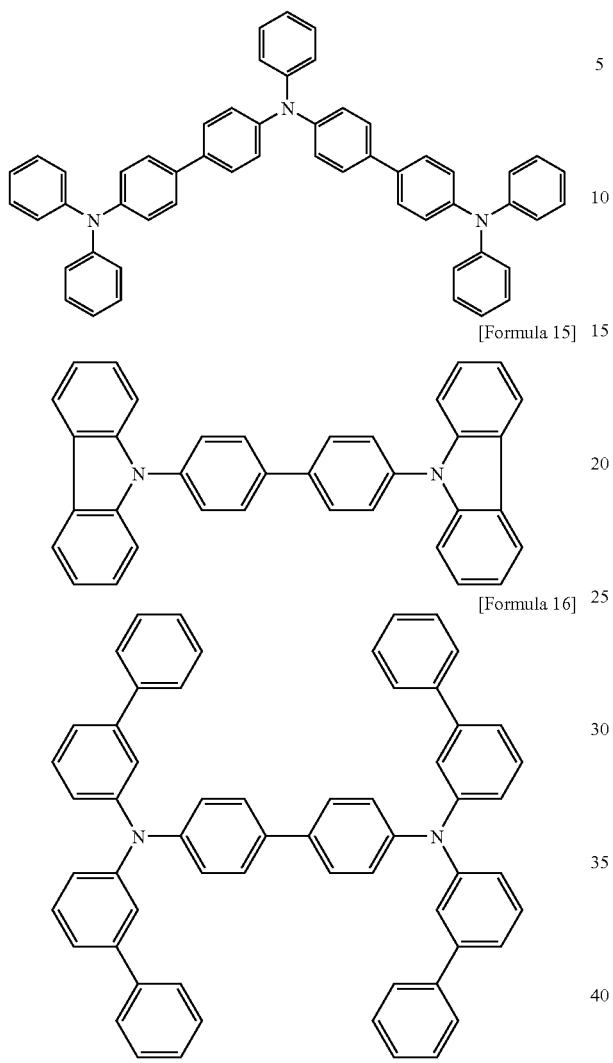

[Formula 15]

[Formula 16]

The average thickness of the hole-transport layer 5 is preferably, but not limited to, approximately in the range of 10 to 150 nm, more preferably approximately in the range of 10 to 100 nm.

Either the hole-transport layer 5 or the hole-injection layer 4 may be omitted.

Red-Light-Emitting Layer

The red-light-emitting layer (a first light-emitting layer) 6 contains a red-light-emitting material that emits red light (a first color; light having a peak in a wavelength region in the vicinity of 600 nm).

In particular, the red-light-emitting layer 6 contains a material of the same type as a first material of the intermediate layer 7 described below. The first material will be described in detail below for the intermediate layer 7.

The red-light-emitting material may be, but not limited to, a red fluorescent material, a red phosphorescent material, or a combination thereof.

The red fluorescent material may be any material that produces red fluorescence, for example, a dibenzo{[f,f']-4,4',7,7'-tetraphenyl}diindeno{1,2,3-cd:1',2',3'-lm}perylene derivative, such as a compound having the following formula 17 (dibenzo{[f,f']-4,4',7,7'-tetraphenyl}diindeno{1,2,3-cd: 1',2',3'-lm}perylene), a europium complex, a benzopyran derivative, a rhodamine derivative, a benzothioxanthen derivative, a porphyrin derivative, nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene) propanedinitrile (DCJTB), or 4-(dicyanomethylene)-2-methyl-6-(p-dimethylaminostyryl)-4H-pyran (DCM).

[Formula 17]

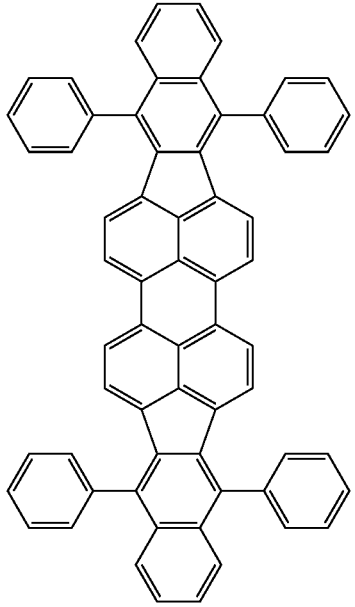

Among others, a dibenzo{[f,f']-4,4',7,7'-tetraphenyl}diindeno{1,2,3-cd:1',2',3'-lm}perylene derivative is preferred. This derivative allows the red-light-emitting layer 6 to emit brighter red light.

The red phosphorescent material may be any material that produces red phosphorescence, for example, a metal complex of iridium, ruthenium, platinum, osmium, rhenium, or palladium, or a material in which at least one ligand of the metal complex has a phenylpyridine skeleton, a bipyridyl skeleton, or a porphyrin skeleton. More specifically, the red phosphorescent material may be tris(1-phenylisoquinoline)iridium, bis[2-(2'-benzo[4,5-α]thienyl)pyridinate-N,C3']iridium (acetylacetonate) (btp2Ir(acac)), 2,3,7,8,12,13,17,18-octaethyl-12H,23H-porphyrin-platinum (II), bis[2-(2'-benzo[4,5-α]thienyl)pyridinate-N,C3']iridium, or bis(2-phenylpyridine)iridium(acetylacetonate).

In addition to the red-light-emitting material, the red-light-emitting layer 6 may contain a host material to which the red-light-emitting material is added as a guest material.

The host material allows a positive hole and an electron to recombine with each other to generate an exciton, and transfers the energy of the exciton to the red-light-emitting material (Forster energy transfer or Dexter energy transfer), thereby exciting the red-light-emitting material. The host material may be doped with the guest material, the red-light-emitting material, as a dopant.

The host material may be any material that has the above-mentioned effects on the red-light-emitting material. When the red-light-emitting material contains a red fluorescent material, the host material may be a naphthacene derivative, such as a compound having the following formula 18, a distyrylarylene derivative, a perylene derivative, a distyrylbenzene derivative, a distyrylamine derivative, a quinolinolato metal complex, such as a tris(8-quinolinolato)aluminum complex (Alq₃), a triarylamine derivative, such as a triphenylamine tetramer, an oxadiazole derivative, a silole derivative, a dicarbazole derivative, an oligothiophene derivative, a benzopyran derivative, a triazole derivative, a benzoxazole derivative, a benzothiazole derivative, a quinoline derivative, 4,4'-bis(2,2'-diphenylvinyl)biphenyl (DPVBi), or a combination thereof.

[Formula 18]

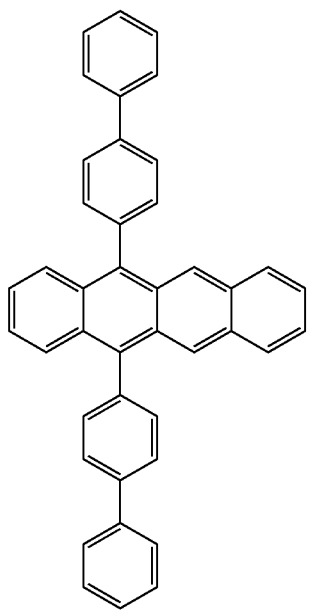

Among others, a naphthacene derivative is preferred. In particular, when the red-light-emitting material is a dibenzo{[f,f']-4,4',7,7'-tetraphenyl}diindeno{1,2,3-cd:1',2',3'-lm}perylene derivative, the red-light-emitting layer 6 containing a naphthacene derivative can emit brighter red light with higher efficiency. Thus, the red-light-emitting layer 6 has high luminous efficacy.

When the red-light-emitting material contains a red phosphorescent material, the host material may be a carbazole derivative, such as 3-phenyl-4-(1'-naphthyl)-5-phenylcarbazole or 4,4'-N,N'-dicarbazolebiphenyl (CBP), or a combination thereof.

In the presence of the red-light-emitting material (guest material) and the host material described above, the content (doping level) of the red-light-emitting material in the red-light-emitting layer 6 preferably ranges from 0.01% to 10% by weight, more preferably from 0.1% to 5% by weight. In these ranges, the red-light-emitting layer 6 can have optimum luminous efficacy.

Such a red-light-emitting material has a relatively small band gap, can easily trap positive holes and electrons, and easily emit light. When the red-light-emitting layer 6 is disposed on the side of the anode 3, the blue-light-emitting layer 8 and the green-light-emitting layer 9, which have a large band gap and emit light less easily, can be disposed on the side of the cathode 12, thus achieving well-balanced light emission.

The average thickness of the red-light-emitting layer 6 is preferably, but not limited to, approximately in the range of 10 to 150 nm, more preferably approximately in the range of 10 to 100 nm.

Intermediate Layer

The intermediate layer 7 is disposed between and in contact with the red-light-emitting layer 6 and the blue-light-emitting layer 8 described below. The intermediate layer 7 functions to control the transfer of carriers (positive holes and electrons) between the red-light-emitting layer 6 and the blue-light-emitting layer 8.

The intermediate layer 7 functions to prevent energy transfer of excitons between the red-light-emitting layer 6 and the blue-light-emitting layer 8.

These functions allow the red-light-emitting layer 6 and the blue-light-emitting layer 8 to emit light efficiently.

In particular, the intermediate layer 7 contains at least two materials.

One of the at least two materials is a material of the same type as a material contained in the red-light-emitting layer 6, and another of the at least two materials is a material of the same type as a material contained in the blue-light-emitting layer 8 and the green-light-emitting layer 9. Thus, the intermediate layer 7 and the red-light-emitting layer 6 contain a common material (hereinafter also referred to as a "first material"), and the intermediate layer 7, the blue-light-emitting layer 8, and the green-light-emitting layer 9 contain a common material (hereinafter also referred to as a "second material") that is different from the first material.

Thus, the intermediate layer 7 can appropriately restrict electron transfer from the blue-light-emitting layer 8 to the red-light-emitting layer 6 and at the same time promote electron transfer from the green-light-emitting layer 9 to the blue-light-emitting layer 8 and from the blue-light-emitting layer 8 to the intermediate layer 7 as well as hole transport from the red-light-emitting layer 6 to the intermediate layer 7.

Thus, the light-emitting element 1 according to the present embodiment can emit white light even with a small electric current. The light-emitting element 1 can therefore produce a substantially constant color regardless of variations in electric current and emit white light.

More specifically, the intermediate layer 7 may contain any material that has functions as described above and, for example, preferably contains a hole-transport material and naphthalene or a material having an acene skeleton (hereinafter also referred to as an "acene-based material").

When the intermediate layer 7 contains a hole-transport material and an acene-based material, the red-light-emitting layer 6 contains as a first material a hole-transport material of the same type as the hole-transport material contained in the intermediate layer 7. In this case, the blue-light-emitting layer 8 and the green-light-emitting layer 9 contain as a second material an acene-based material of the same type as the acene-based material contained in the intermediate layer 7.

The hole-transport material of the intermediate layer 7 may be any material that has a high hole-transport ability and may be of the same type as that of the hole-transport layer 5.

In particular, the hole-transport materials (amine-based materials) described above have a high hole-transport ability. The intermediate layer 7 containing such a hole-transport material can smoothly transport positive holes from the red-light-emitting layer 6 to the blue-light-emitting layer 8. The intermediate layer 7 also functions to restrict electron transfer from the blue-light-emitting layer 8 to the red-light-emitting layer 6.

The acene-based material of the intermediate layer 7 may be any material that has an acene skeleton and the effects described above and may be a naphthalene derivative, an anthracene derivative, such as a compound having any of the following formulae 19 to 30, a naphthacene derivative (tetracene derivative), a pentacene derivative, a hexacene derivative, a heptacene derivative, or a combination thereof.

[Formula 19]
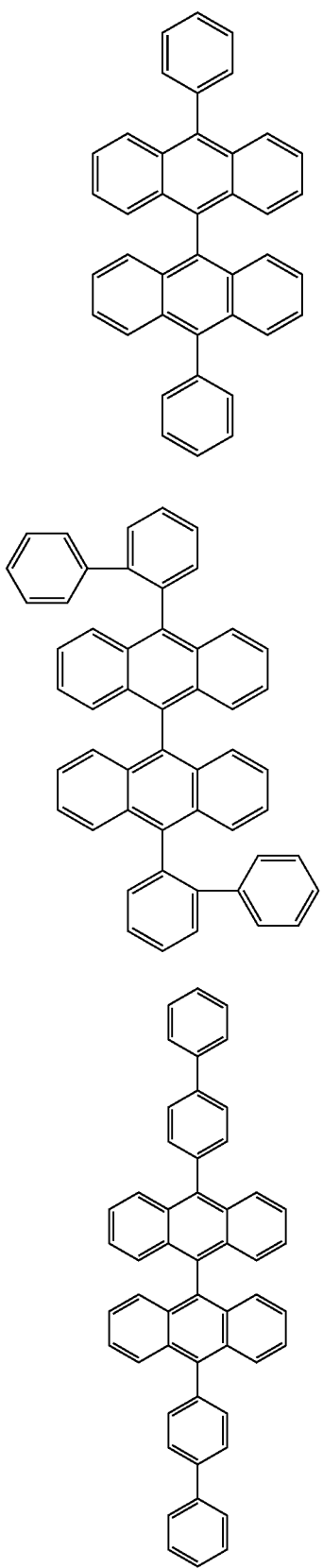
[Formula 20]
[Formula 21]
[Formula 22]
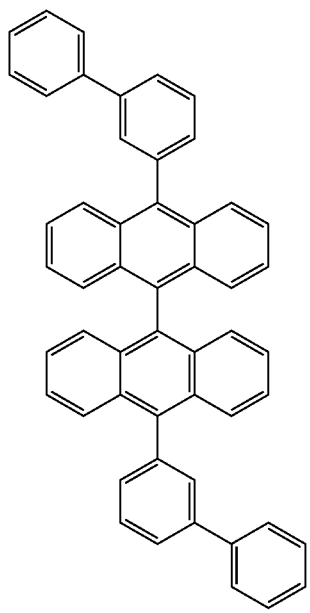
[Formula 23]
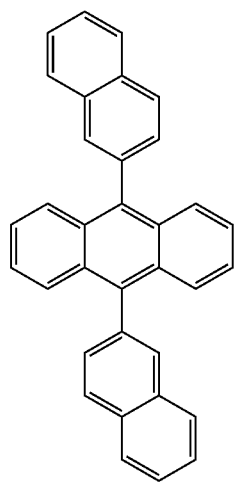
[Formula 24]
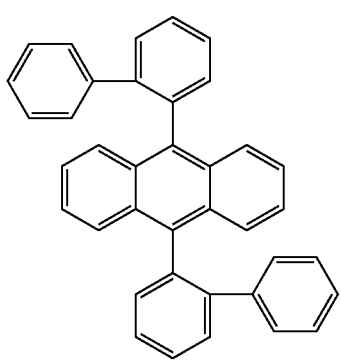

[Formula 25]
[Formula 26]
[Formula 27]
[Formula 28]
[Formula 29]
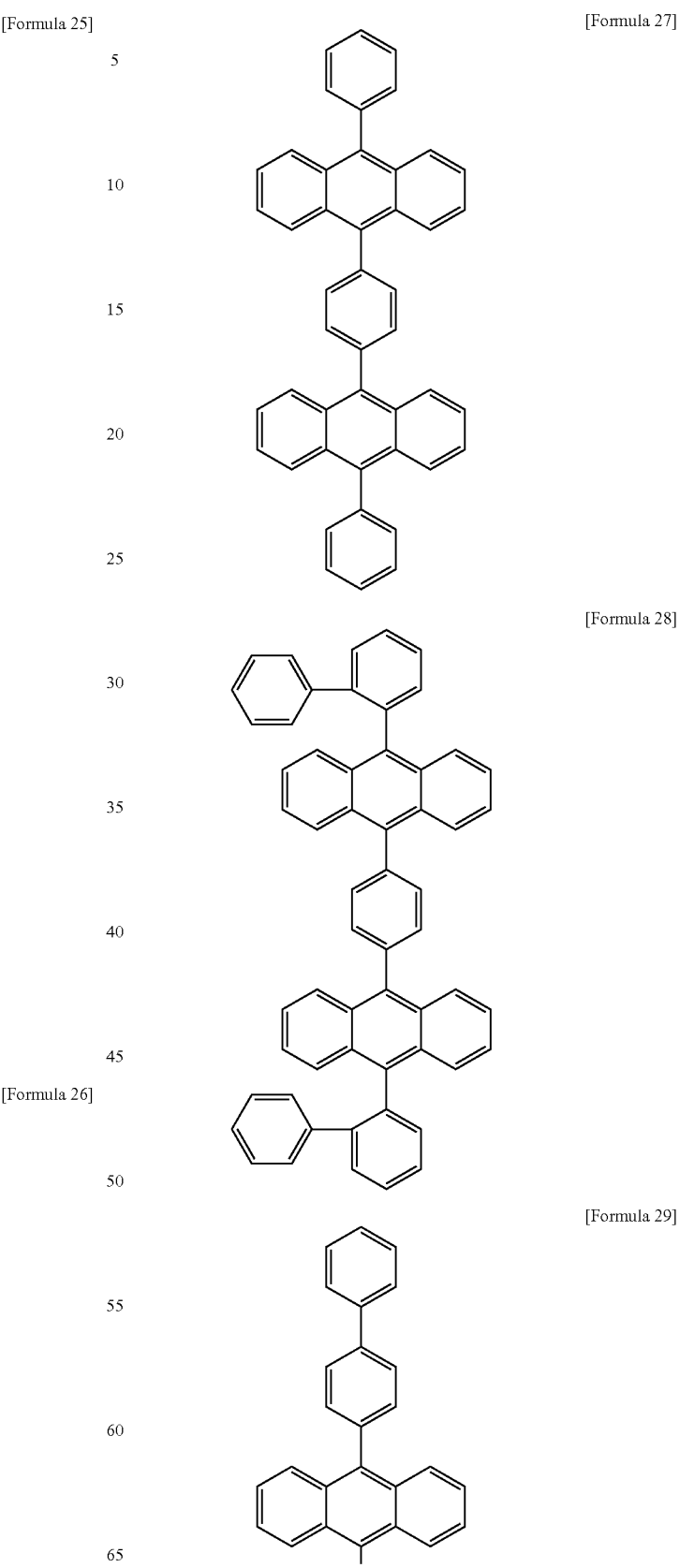

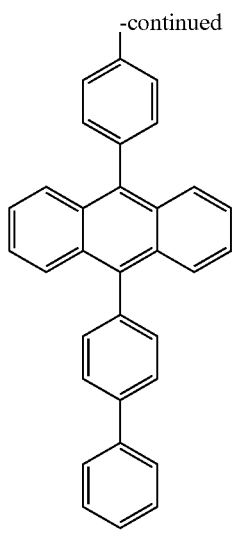

[Formula 30]

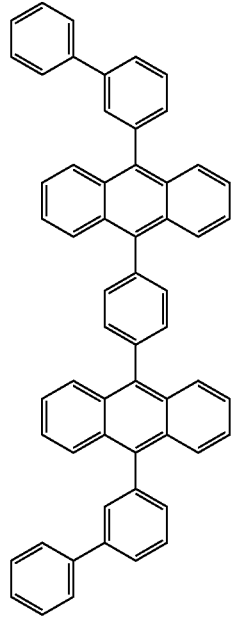

An anthracene derivative has a high electron-transfer ability and can be easily formed into a film by a vapor deposition method. The acene-based material (and therefore the intermediate layer 7) composed of an anthracene derivative has a high electron-transfer ability and can be easily and uniformly formed into the intermediate layer 7.

Since the acene-based material has a high electron-transfer ability, an intermediate layer 7 mainly formed of a mixture of the acene-based material and the hole-transport material can smoothly transport positive holes from the red-light-emitting layer 6 to the blue-light-emitting layer 8 and electrons from the blue-light-emitting layer 8 to the red-light-emitting layer 6. Thus, such an intermediate layer 7 is a bipolar layer. The intermediate layer 7 is therefore highly resistant to electrons and positive holes. This can prevent the degradation of the intermediate layer 7 and thereby improve the durability of the light-emitting element 1.

Preferably, the intermediate layer 7 contains as a first material a benzidine derivative, such as a compound having one of the formulae 11 to 16, and as a second material an anthracene derivative, such as a compound having one of the formulae 19 to 30.

The intermediate layer 7 containing a benzidine derivative as the first material and an anthracene derivative as the second material can promote electron transfer from the green-light-emitting layer 9 to the blue-light-emitting layer 8 and from the blue-light-emitting layer 8 to the intermediate layer 7 as well as hole transport from the red-light-emitting layer 6 to the intermediate layer 7.

As described above, when the red-light-emitting layer 6 contains the guest material and the host material, the first material is preferably different from the guest material and the host material of the red-light-emitting layer 6. This allows the first material to be selected such that the intermediate layer 7 can appropriately restrict electron transfer from the blue-light-emitting layer 8 to the red-light-emitting layer 6 and allows the red-light-emitting layer 6 to emit light efficiently. In other words, this increases the range of selection of the guest material and the host material of the red-light-emitting layer 6, thereby facilitating optimization of the guest material and the host material of the red-light-emitting layer 6 and improving the luminous efficacy of the red-light-emitting layer 6.

When the blue-light-emitting layer 8 contains a guest material and a host material, as described below, the second material is preferably a material of the same type as the host material of the blue-light-emitting layer 8. This promotes electron transfer from the blue-light-emitting layer 8 to the intermediate layer 7 and allows the blue-light-emitting layer 8 to emit light efficiently.

When the green-light-emitting layer 9 contains a guest material and a host material, as described below, the second material is preferably a material of the same type as the host material of the green-light-emitting layer 9. This can promote electron transfer from the green-light-emitting layer 9 to the blue-light-emitting layer 8 and allows the green-light-emitting layer 8 to emit light efficiently.

Preferably, the hole-transport layer 5 also contains the first material. The hole-transport layer 5 containing a material of the same type as the first material can promote hole transport from the hole-transport layer 5 to the red-light-emitting layer 6.

Although the intermediate layer 7 may contain a material other than the first material and the second material described above, the intermediate layer 7 is preferably formed mainly of a mixture of the first material and the second material. More specifically, the content of a mixture of the first material and the second material in the intermediate layer 7 preferably ranges from 70% to 100% by mass, more preferably 80% to 100% by mass, still more preferably 90% to 100% by mass. Thus, the intermediate layer 7 can appropriately restrict electron transfer from the blue-light-emitting layer 8 to the red-light-emitting layer 6 and at the same time promote electron transfer from the green-light-emitting layer 9 to the blue-light-emitting layer 8 and from the blue-light-emitting layer 8 to the intermediate layer 7 as well as hole transport from the red-light-emitting layer 6 to the intermediate layer 7.

The ratio of the content A [% by mass] of the first material to the content B [% by mass] of the second material in the intermediate layer 7 preferably ranges from 10:90 to 90:10, more preferably 30:70 to 70:30, sill more preferably 40:60 to 60:40. Within this range, the intermediate layer 7 has a high electron-transfer ability and a high hole-transport ability.

Outside the range, the light-emitting element 1 may lack emission uniformity or require a significantly high driving voltage.

The average thickness of the intermediate layer 7 is preferably, but not limited to, in the range of 2.5 to 20 nm, more preferably in the range of 6 to 17 nm, still more preferably in the range of 7 to 16 nm. This can reduce the driving voltage of the light-emitting element 1 and ensure that the intermediate layer 7 prevents energy transfer of excitons between the red-light-emitting layer 6 and the blue-light-emitting layer 8.

When the average thickness of the intermediate layer 7 exceeds the upper limit, depending on the material of the intermediate layer 7, the light-emitting element 1 may require a significantly high driving voltage or cannot emit light (particularly white-light emission). When the average thickness of the intermediate layer 7 is below the lower limit, depending on the material of the intermediate layer 7 or the driving voltage, the intermediate layer 7 cannot prevent or reduce energy transfer of excitons between the red-light-emitting layer 6 and the blue-light-emitting layer 8, and the intermediate layer 7 may be less resistant to carriers and excitons.

Blue-Light-Emitting Layer

The blue-light-emitting layer (a second light-emitting layer) 8 contains a blue-light-emitting material that emits blue light (a second color).

The blue-light-emitting layer 8 contains a material of the same type as the second material.

The blue-light-emitting material may be, but not limited to, a blue fluorescent material, a blue phosphorescent material, or a combination thereof.

The blue fluorescent material may be any material that produces blue fluorescence, for example, a compound having the following formula 31, a distyrylmonoamine derivative, a distyryldiamine derivative, a fluoranthene derivative, a pyrene derivative, a perylene or perylene derivative, an anthracene derivative, a benzoxazole derivative, a benzothiazole derivative, a benzoimidazole derivative, a chrysene derivative, a phenanthrene derivative, a distyrylbenzene derivative, a tetraphenylbutadiene, 4,4'-bis(9-ethyl-3-carbazovinylene)-1,1'-biphenyl (BCzVBi), poly[(9.9-dioctylfluorene-2,7-diyl)-co-(2,5-dimethoxybenzene-1,4-diyl)], poly[(9,9-dihexyloxyfluorene-2,7-diyl)-ortho-co-(2-methoxy-5-{2-ethoxyhexyloxy}phenylene-1,4-diyl)], poly[(9,9-dioctylfluorene-2,7-diyl)-co-(ethynylbenzene)], or a combination thereof.

[Formula 31]

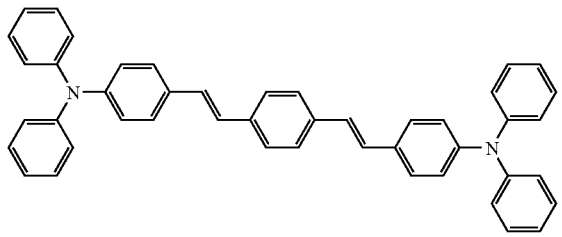

The blue phosphorescent material may be any material that produces blue phosphorescence, for example, a metal complex of iridium, ruthenium, platinum, osmium, rhenium, or palladium. More specifically, the blue phosphorescent material may be bis[4,6-difluorophenylpyridinate-N,C2']-picolinate-iridium, tris[2-(2,4-difluorophenyl)pyridinate-N,C2'] iridium, bis[2-(3,5-trifluoromethyl)pyridinate-N,C2']-picolinate-iridium, or bis(4,6-difluorophenylpyridinate-N,C2')iridium(acetylacetonate).

As in the red-light-emitting layer 6, in addition to the blue-light-emitting material, the blue-light-emitting layer 8 may further contain a host material to which the blue-light-emitting material is added as a guest material.

In the presence of the blue-light-emitting material (guest material) and the host material described above, the content (doping level) of the blue-light-emitting material in the blue-light-emitting layer 8 preferably ranges from 0.01% to 10% by weight, more preferably from 0.1% to 5% by weight.

The average thickness of the blue-light-emitting layer 8 is preferably, but not limited to, approximately in the range of 10 to 150 nm, more preferably approximately in the range of 10 to 100 nm.

Green-Light-Emitting Layer

The green-light-emitting layer (a third light-emitting layer) 9 contains a green-light-emitting material that emits green light (a third color).

The green-light-emitting layer 9 contains a material of the same type as the second material.

The green-light-emitting material may be, but not limited to, a green fluorescent material, a green phosphorescent material, or a combination thereof.

The green fluorescent material may be any material that produces green fluorescence, for example, a coumarin derivative, a quinacridone derivative, such as a compound having the following formula 32, 9,10-bis[(9-ethyl-3-carbazole)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], poly[(9,9-dioctyl-2,7-divinylenefluorenylene)-ortho-co-(2-methoxy-5-(2-ethoxyhexyloxy)-1,4-phenylene)], or a combination thereof.

[Formula 32]

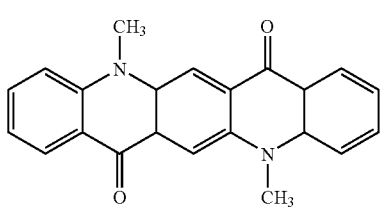

The green phosphorescent material may be any material that produces green phosphorescence, for example, a metal complex of iridium, ruthenium, platinum, osmium, rhenium, or palladium. Among others, a material in which at least one ligand of the metal complex has a phenylpyridine skeleton, a bipyridyl skeleton, or a porphyrin skeleton is preferred. More specifically, the green phosphorescent material may be fac-tris(2-phenylpyridine)iridium (Ir(ppy)$_3$), bis(2-phenylpyridinate-N,C2')iridium(acetylacetonate), or fac-tris[5-fluoro-2-(5-trifluoromethyl-2-pyridine)phenyl-C,N]iridium.

As in the red-light-emitting layer 6, in addition to the green-light-emitting material, the green-light-emitting layer 9 may further contain a host material to which the green-light-emitting material is added as a guest material.

In the presence of the green-light-emitting material (guest material) and the host material described above, the content (doping level) of the green-light-emitting material in the green-light-emitting layer 9 preferably ranges from 0.01% to 10% by weight, more preferably from 0.1% to 5% by weight.

The average thickness of the green-light-emitting layer 9 is preferably, but not limited to, approximately in the range of 10 to 150 nm, more preferably approximately in the range of 10 to 100 nm.

Electron-Transfer Layer

The electron-transfer layer 10 functions to transfer electrons, injected from the cathode 12 through the electron-injection layer 11, to the green-light-emitting layer 9.

The material (electron-transfer material) of the electron-transfer layer 10 may be a quinoline derivative, such as an organometallic complex that contains 8-quinolinol or a derivative thereof as a ligand, for example, tris(8-quinolinolato)aluminum (Alq$_3$) having the following formula 33, an oxadiazole derivative, a perylene derivative, a pyridine derivative, a pyrimidine derivative, a quinoxaline derivative, a diphenylquinone derivative, a nitro-substituted fluorene derivative, or a combination thereof.

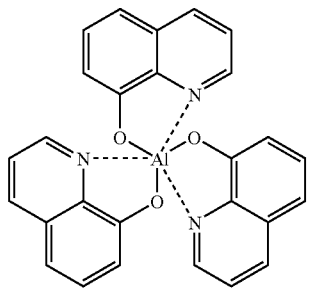

[Formula 33]

The average thickness of the electron-transfer layer 10 is preferably, but not limited to, approximately in the range of 0.5 to 100 nm, more preferably approximately in the range of 1 to 50 nm.

Electron-Injection Layer

The electron-injection layer 11 functions to improve the efficiency of electron injection from the cathode 12.

The material (electron-injection material) of the electron-injection layer 11 may be an inorganic insulating material or an inorganic semiconducting material.

Examples of the inorganic insulating material include alkali metal chalcogenides (oxides, sulfides, selenides, and tellurides), alkaline earth metal chalcogenides, alkali metal halides, and alkaline earth metal halides. These inorganic insulating materials may be used alone or in combination. An electron-injection layer mainly formed of such an inorganic insulating material can have an improved electron injection ability. In particular, since an alkali metal compound (such as an alkali metal chalcogenide or an alkali metal halide) has a very low work function, a light-emitting element 1 that includes an electron-injection layer 11 formed of the alkali metal compound has high luminance.

Examples of the alkali metal chalcogenides include Li$_2$O, LiO, Na$_2$S, Na$_2$Se, and NaO.

Examples of the alkaline earth metal chalcogenides include CaO, BaO, SrO, BeO, BaS, MgO, and CaSe.

Examples of the alkali metal halides include CsF, LiF, NaF, KF, LiCl, KCl, and NaCl.

Examples of the alkaline earth metal halides include CaF$_2$, BaF$_2$, SrF$_2$, MgF$_2$, and BeF$_2$.

Examples of the inorganic semiconducting materials include oxides, nitrides, and oxynitrides containing at least one element selected from the group consisting of Li, Na, Ba, Ca, Sr, Yb, Al, Ga, In, Cd, Mg, Si, Ta, Sb, and Zn. These inorganic semiconducting materials may be used alone or in combination.

The average thickness of the electron-injection layer 11 is preferably, but not limited to, approximately in the range of 0.1 to 1000 nm, more preferably approximately in the range of 0.2 to 100 nm, still more preferably approximately in the range of 0.2 to 50 nm.

Sealing Member

The sealing member 13 hermetically seals the anode 3, the laminate 15, and the cathode 12 to block oxygen and water. The sealing member 13 provides advantages, such as an improvement in the reliability of the light-emitting element 1 and prevention of the deterioration and degradation of the light-emitting element 1 (an improvement in durability).

Examples of the material of the sealing member 13 include Al, Au, Cr, Nb, Ta, Ti, alloys thereof, silicon oxide, and various resin materials. When the sealing member 13 is formed of an electroconductive material, if necessary, the sealing member 13 is preferably separated by an insulating film from the anode 3, the laminate 15, and the cathode 12 to prevent a short circuit.

Alternatively, the sealing member 13 may be a flat member opposite the substrate 2, and a space therebetween may be filled with a sealant such as a thermosetting resin.

In the light-emitting element 1 thus fabricated, the intermediate layer 7 and the red-light-emitting layer 6 contain the first material, and the intermediate layer 7, the blue-light-emitting layer 8, and the green-light-emitting layer 9 contain the second material different from the first material. The intermediate layer 7 can therefore appropriately restrict electron transfer from the blue-light-emitting layer 8 to the red-light-emitting layer 6 and promote electron transfer from the green-light-emitting layer 9 to the blue-light-emitting layer 8 and from the blue-light-emitting layer 8 to the intermediate layer 7 as well as hole transport from the red-light-emitting layer 6 to the intermediate layer 7.

Thus, the light-emitting element 1 according to the present embodiment can emit white light even with a small electric current.

The light-emitting element 1 can be fabricated as described below.

(1) First, prepare a substrate 2 and form an anode 3 on the substrate 2.

The anode 3 may be formed by dry plating, for example, chemical vapor deposition (CVD), such as plasma CVD or thermal CVD, or vacuum evaporation; wet plating, such as electroplating; thermal spraying; the sol-gel process; metal organic deposition (MOD); or metal foil bonding.

(2) Form a hole-injection layer 4 on the anode 3.

The hole-injection layer 4 can be formed by a gas phase process involving dry plating, such as CVD, vacuum evaporation, or sputtering.

The hole-injection layer 4 can also be formed in another way. For example, a hole-injecting material is dissolved in a solvent or dispersed in a dispersion medium to prepare a material for the formation of a hole-injection layer. The material for the formation of a hole-injection layer is applied to the anode 3 and is dried (removal of the solvent or the dispersion medium).

The material for the formation of a hole-injection layer may be applied by a coating method, such as spin coating, roll coating, or ink jet printing. The hole-injection layer 4 can be formed relatively easily by such a coating method.

Examples of the solvent or the dispersion medium used in the preparation of the material for the formation of a hole-injection layer include various inorganic solvents, various organic solvents, and mixed solvents thereof.

The drying may be performed by leaving the sample to stand at atmospheric or reduced pressure, by heat treatment, or by spraying an inert gas.

Before this step, the top surface of the anode 3 may be treated with oxygen plasma. This treatment can provide a lyophilic surface on the anode 3, remove organic substances deposited on the top surface of the anode 3, and control work function in the vicinity of the top surface of the anode 3.

Preferably, the oxygen plasma treatment is performed at a plasma power approximately in the range of 100 to 800 W, an oxygen gas flow rate approximately in the range of 50 to 100 mL/min, a sample (anode 3) transport rate approximately in the range of 0.5 to 10 mm/sec, and a temperature of the substrate 2 approximately in the range of 70° C. to 90° C.

(3) Form a hole-transport layer 5 on the hole-injection layer 4.

The hole-transport layer 5 may be formed by a gas phase process involving dry plating, such as CVD, vacuum evaporation, or sputtering.

The hole-transport layer 5 can also be formed in another way. For example, a hole-transport material is dissolved in a solvent or dispersed in a dispersion medium to prepare a material for the formation of a hole-transport layer. The material for the formation of a hole-transport layer is applied to the hole-injection layer 4 and is dried (removal of the solvent or the dispersion medium).

(4) Form a red-light-emitting layer 6 on the hole-transport layer 5.

The red-light-emitting layer 6 can be formed by a gas phase process involving dry plating, such as CVD, vacuum evaporation, or sputtering.

(5) Form an intermediate layer 7 on the red-light-emitting layer 6.

The intermediate layer 7 can be formed by a gas phase process involving dry plating, such as CVD, vacuum evaporation, or sputtering.

(6) Form a blue-light-emitting layer 8 on the intermediate layer 7.

The blue-light-emitting layer 8 can be formed by a gas phase process involving dry plating, such as CVD, vacuum evaporation, or sputtering.

(7) Form a green-light-emitting layer 9 on the blue-light-emitting layer 8.

The green-light-emitting layer 9 can be formed by a gas phase process involving dry plating, such as CVD, vacuum evaporation, or sputtering.

(8) Form an electron-transfer layer 10 on the green-light-emitting layer 9.

The electron-transfer layer 10 can be formed by a gas phase process involving dry plating, such as CVD, vacuum evaporation, or sputtering.

The electron-transfer layer 10 can also be formed in another way. For example, an electron-transfer material is dissolved in a solvent or dispersed in a dispersion medium to prepare a material for the formation of an electron-transfer layer. The material for the formation of an electron-transfer layer is applied to the green-light-emitting layer 9 and is dried (removal of the solvent or the dispersion medium).

(9) Form an electron-injection layer 11 on the electron-transfer layer 10.

An electron-injection layer 11 formed of an inorganic material can be formed by a gas phase process involving dry plating, such as CVD, vacuum evaporation, or sputtering, or application and firing of an inorganic fine particle ink.

(10) Form a cathode 12 on the electron-injection layer 11.

The cathode 12 can be formed by vacuum evaporation, sputtering, metal foil bonding, or application and firing of a fine metal particle ink.

Finally, a sealing member 13 is formed on the substrate 2 to cover the anode 3, the laminate 15, and the cathode 12.

The light-emitting element 1 is fabricated through these processes.

Second Embodiment

A second embodiment according to the invention will be described below.

Figure 2:
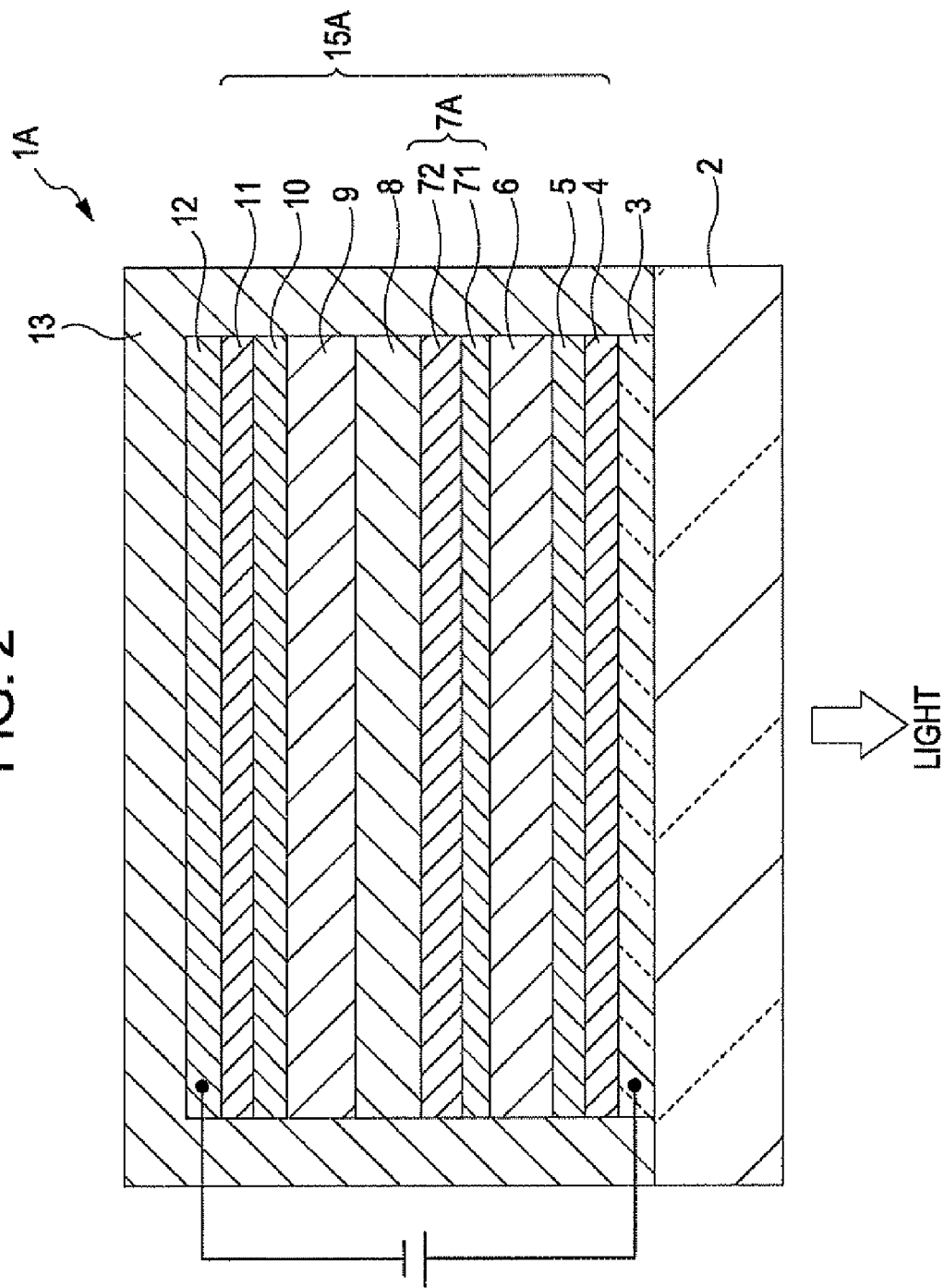
FIG. 2 is a schematic longitudinal sectional view of a light-emitting element according to a second embodiment of the invention.

FIG. 2 is a schematic longitudinal sectional view of a light-emitting element according to a second embodiment of the invention. For convenience of explanation, the top and bottom in FIG. 2 are considered as the "top" and "bottom" of the light-emitting element, respectively.

A light-emitting element according to the present embodiment is the same as the light-emitting element according to the first embodiment except that the intermediate layer has a different structure.

The following description relates to the light-emitting element according to the second embodiment and is focused on points of difference from the light-emitting element according to the first embodiment. Thus, their similarities will not be further described.

A light-emitting element 1A according to the present embodiment includes an intermediate layer 7A between and in contact with the red-light-emitting layer 6 and the blue-light-emitting layer 8.

The intermediate layer 7A includes a first sublayer 71 in contact with the red-light-emitting layer 6 and a second sublayer 72 in contact with the first sublayer 71 and the blue-light-emitting layer 8.

The first sublayer 71 is mainly formed of a first material, and the second sublayer 72 is mainly formed of a second material.

In the light-emitting element 1A including the intermediate layer 7A having such a two-layer structure, the intermediate layer 7A can appropriately restrict electron transfer from the blue-light-emitting layer 8 to the red-light-emitting layer 6 and at the same time promote electron transfer from the green-light-emitting layer 9 to the blue-light-emitting layer 8 and from the blue-light-emitting layer 8 to the intermediate layer 7A as well as hole transport from the red-light-emitting layer 6 to the intermediate layer 7A.

In addition, the intermediate layer 7A can reduce electrons accumulating in the vicinity of the interface between the intermediate layer 7A and the blue-light-emitting layer 8. This can prevent the degradation and deterioration of the blue-light-emitting layer 8, extending the life of the light-emitting element 1A.

The content of the first material in the first sublayer 71 of the intermediate layer 7A is preferably, but not limited to, in the range of 60% to 100% by mass. This allows the intermediate layer 7A to appropriately restrict electron transfer from the blue-light-emitting layer 8 to the red-light-emitting layer 6 and promote hole-transport from the red-light-emitting layer 6 to the intermediate layer 7A.

Preferably, the first sublayer 71 contains the second material. This can promote electron transfer from the intermediate layer 7A to the red-light-emitting layer 6.

The ratio of the content C [% by mass] of the first material to the content D [% by mass] of the second material in the first sublayer 71 preferably ranges from 60:40 to 90:10, more preferably 60:40 to 80:20, sill more preferably 60:40 to 70:30. Within this range, the intermediate layer 7A has a high electron-transfer ability and a high hole-transport ability.

Outside the range, the light-emitting element 1A may lack emission uniformity or require a significantly high driving voltage.

The content of the second material in the second sublayer 72 of the intermediate layer 7A is preferably, but not limited to, in the range of 60% to 100% by mass. This can promote electron transfer from the blue-light-emitting layer 8 to the intermediate layer 7A.

Preferably, the second sublayer 72 contains the first material. This can promote hole transport from the intermediate layer 7A to the blue-light-emitting layer 8.

The ratio of the content E [% by mass] of the second material to the content F [% by mass] of the first material in the second sublayer 72 preferably ranges from 60:40 to 90:10, more preferably 60:40 to 80:20, sill more preferably 60:40 to 70:30. This can provide the intermediate layer 7A with a moderate electron-blocking ability as well as a high electron-transfer ability and a high hole-transport ability.

Outside the range, the light-emitting element 1A may lack emission uniformity or require a significantly high driving voltage.

As described above, when each of the first sublayer 71 and the second sublayer 72 contains the first material and the second material, and the first sublayer 71 and the second sublayer 72 are different in the ratio of the content of the first material to the content of the second material, the intermediate layer 7A can have a moderate electron-blocking ability while having a high hole-transport ability and a high electron-transfer ability.

As in the thickness of the intermediate layer 7 in the first embodiment, the average thickness of the intermediate layer 7A is preferably, but not limited to, in the range of 2.5 to 20 nm, more preferably in the range of 6 to 17 nm, still more preferably in the range of 7 to 16 nm. This can reduce the driving voltage of the light-emitting element 1A and ensure that the intermediate layer 7A prevents energy transfer of excitons between the red-light-emitting layer 6 and the blue-light-emitting layer 8.

The ratio of the average thickness of the first sublayer 71 to the average thickness of the second sublayer 72 in the intermediate layer 7A depends on the materials of the first sublayer 71 and the second sublayer 72 and is therefore not limited.

Although the first sublayer 71 and the second sublayer 72 have a boundary in FIG. 2 for convenience of explanation, the first sublayer 71 and the second sublayer 72 may have substantially no boundary; for example, the first sublayer 71 and the second sublayer 72 may be formed of a graded material in which the content of the first material gradually increases from the first sublayer 71 to the second sublayer 72.

The light-emitting element 1A has the same advantages as the light-emitting element 1 according to the first embodiment.

The light-emitting elements 1 and 1A can be used as a light source. A matrix of light-emitting elements 1 can constitute a light-emitting apparatus, such as an illuminator or a backlight of a liquid crystal display, or a display apparatus, such as a display system. Such a light-emitting apparatus and a display apparatus are highly reliable. In addition, such a display apparatus can display high-contrast images.

The display system may be, but not limited to, an active-matrix or passive-matrix display system.

A display system to which a display apparatus according to an aspect of the invention is applied will be described below.

Figure 3:
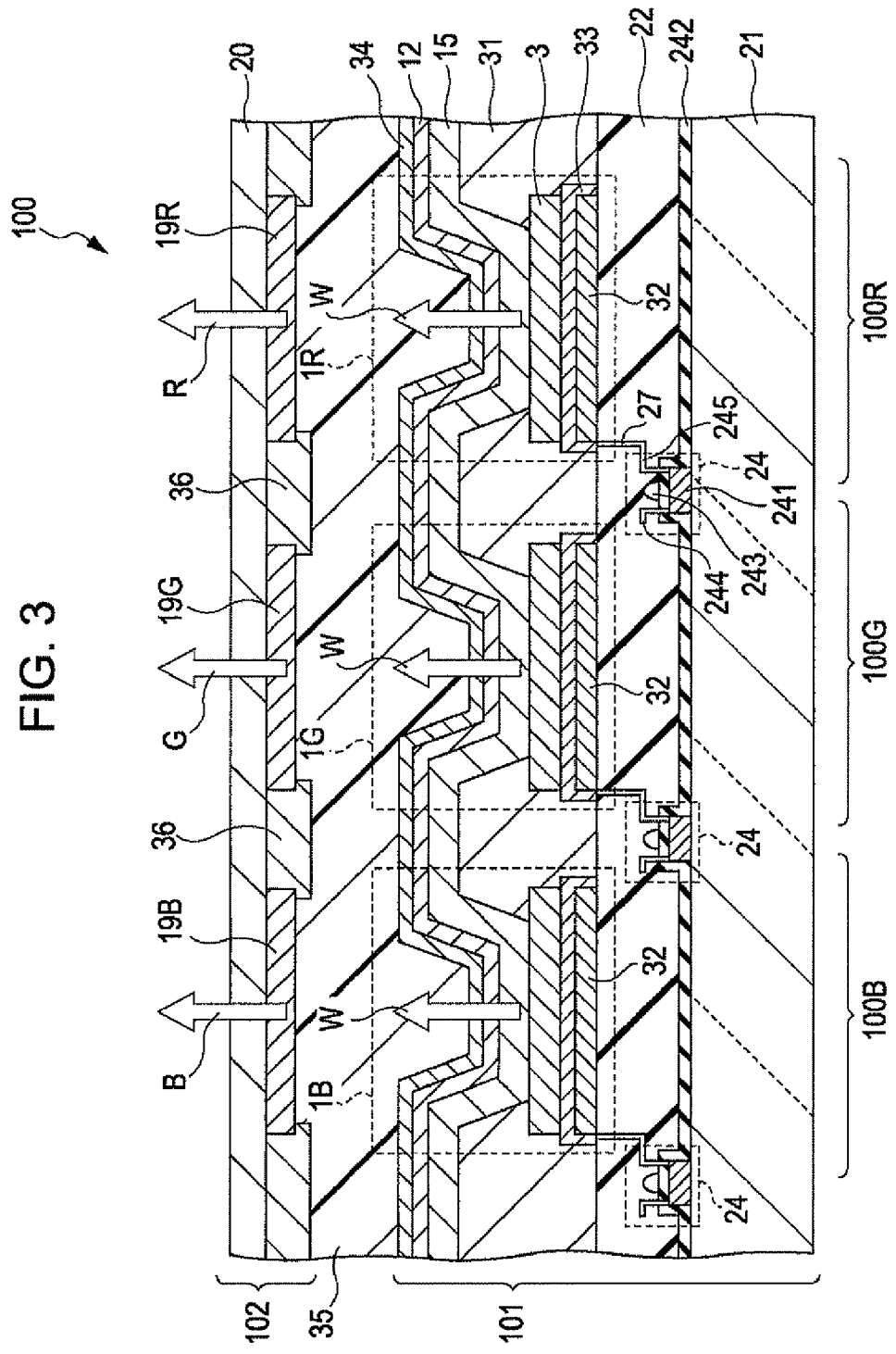
FIG. 3 is a longitudinal sectional view of a display system according to an embodiment of the invention to which a display apparatus according to an aspect of the invention is applied.

FIG. 3 is a longitudinal sectional view of a display system according to an embodiment of the invention to which a display apparatus according to an aspect of the invention is applied.

A display system 100 includes a substrate 21, light-emitting elements 1R, 1G, and 1B and color filters 19R, 19G, and 10B corresponding to sub-pixels 100R, 100G, and 100B, and drive transistors 24 for driving the light-emitting elements 1R, 1G, and 1B. The display system 100 is a display panel having a top emission structure.

A planarization layer 22 formed of an insulating material is disposed on top of the substrate 21 to cover the drive transistors 24.

Each of the drive transistors 24 includes a silicon semiconductor layer 241, a gate-insulating layer 242 on the semiconductor layer 241, a gate electrode 243 on the gate-insulating layer 242, a source electrode 244, and a drain electrode 245.

The light-emitting element 1R, 1G, or 1B is disposed on the planarization layer 22 for each of the drive transistors 24.

The light-emitting element 1R includes a reflective film 32, an anticorrosive film 33, an anode 3, a laminate (an organic EL component) 15, a cathode 12, and a cathode cover 34 on the planarization layer 22 in this order. The anodes 3 of the light-emitting elements 1R, 1G, and 1B act as pixel electrodes and are electrically connected to the drain electrodes 245 of the drive transistors 24 via conductors (wires) 27. The cathode 12 of the light-emitting elements 1R, 1G, and 1B acts as a common electrode.

The light-emitting elements 1G and 1B have the same structure as the light-emitting element 1R. In FIGS. 1 and 3, like numerals designate like components. Depending on the wavelength of light, there may be differences in the structure (characteristics) of the reflective film 32 between the light-emitting elements 1R, 1G, and 1B.

The light-emitting elements 1R, 1G, and 1B are separated by a partition 31. The light-emitting elements 1R, 1G, and 1B are covered with an epoxy layer 35 formed of an epoxy resin.

The color filters 19R, 19G, and 19B corresponding to the light-emitting elements 1R, 1G, and 1B are disposed on the epoxy layer 35.

The color filter 19R converts white light W from the light-emitting element 1R into red light. The color filter 19G converts white light W from the light-emitting element 1G into green light. The color filter 19B converts white light W from the light-emitting element 1B into blue light. The light-emitting elements 1R, 1G, and 1B in combination with the color filters 19R, 19G, and 193 can display full-color images.

The color filters 19R, 19G, and 19B are separated by a light-shielding layer 36. The light-shielding layer 36 can prevent the sub-pixels 100R, 100G, and 100B from emitting light unintentionally.

The color filters 19R, 19G, and 19B and the light-shielding layer 36 are covered with a sealing substrate 20.

The display system 100 may be configured as a monochrome display system or a color display system using specific light-emitting materials for the light-emitting elements 1R, 1G, and 1B.

The display system 100 (a display apparatus according to an aspect of the invention) can be incorporated into various electronic devices. Such electronic devices can display high-contrast images and are highly reliable.

Figure 4:
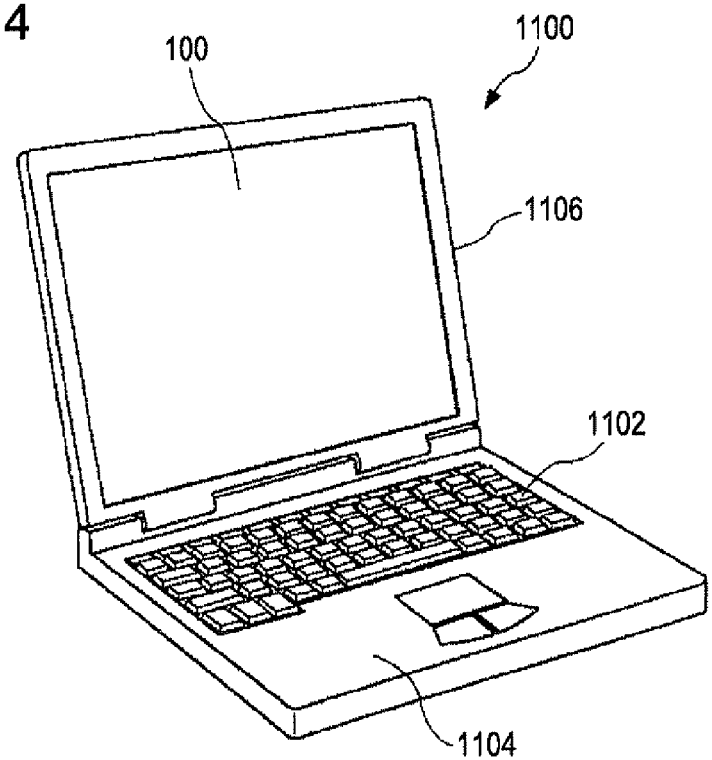
FIG. 4 is a perspective view of a mobile (or notebook) personal computer to which an electronic device according to an aspect of the invention is applied.

FIG. 4 is a perspective view of a mobile (or notebook) personal computer to which an electronic device according to an aspect of the invention is applied.

A personal computer 1100 includes a main body 1104 having a keyboard 1102 and a display unit 1106 having a display. The display unit 1106 is hinged to the main body 1104.

The display of the display unit 1106 corresponds to the display system 100 described above.

Figure 5:
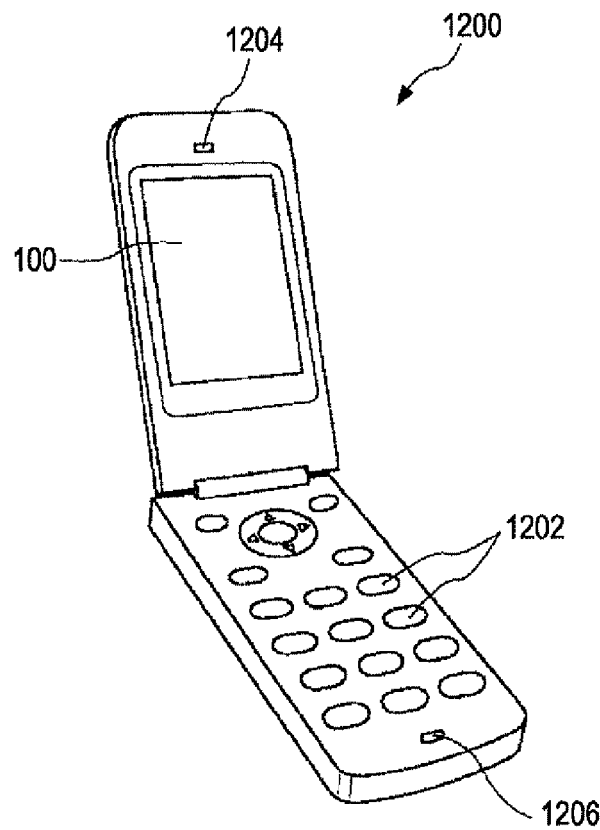
FIG. 5 is a perspective view of a mobile phone (including PHS) to which an electronic device according to an aspect of the invention is applied.

FIG. 5 is a perspective view of a mobile phone (including PHS) to which an electronic device according to an aspect of the invention is applied.

A mobile phone 1200 includes a plurality of operating buttons 1202, an earpiece 1204, a mouthpiece 1206, and a display.

The display corresponds to the display system 100 described above.

Figure 6:
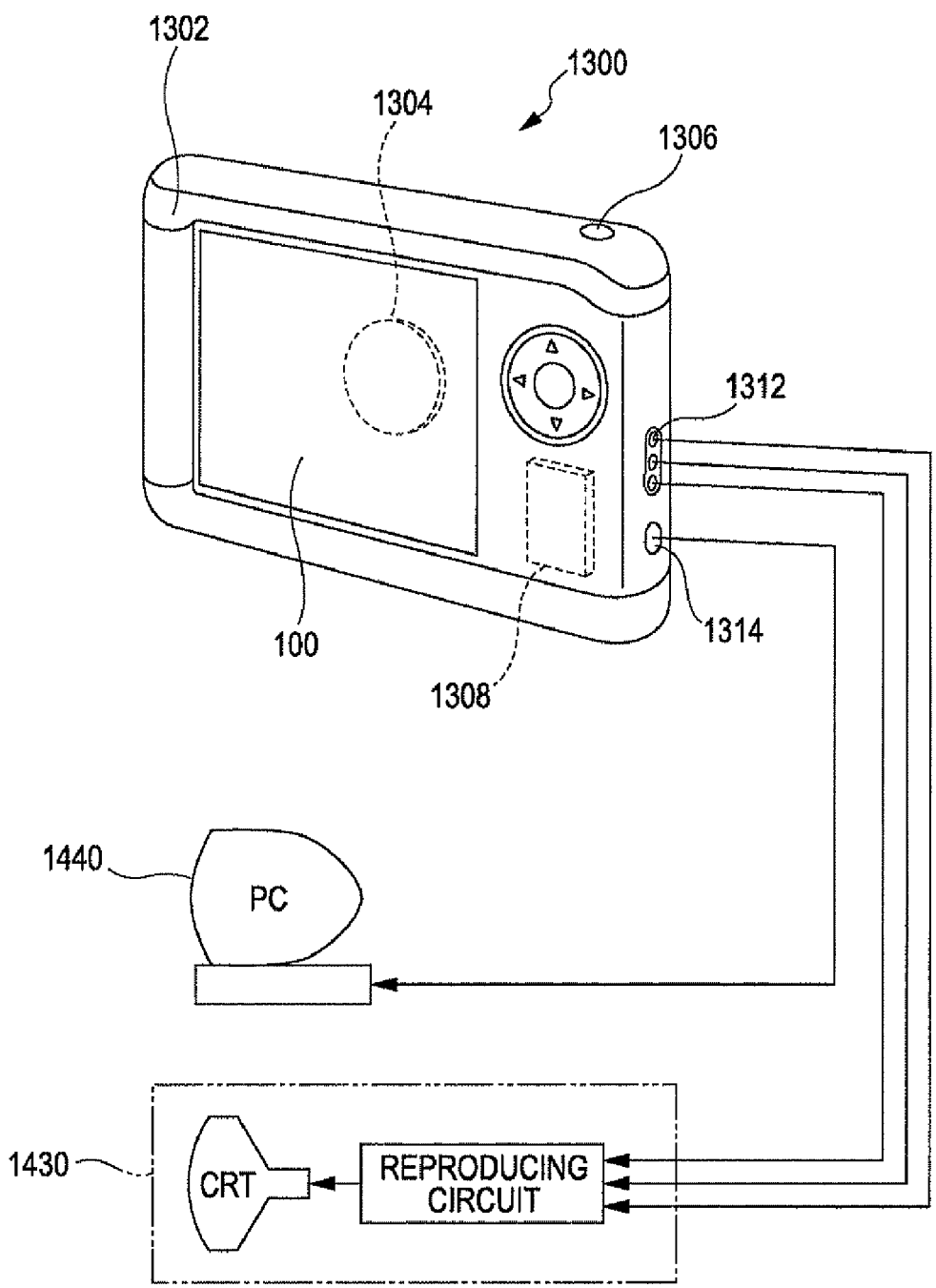
FIG. 6 is a perspective view of a digital still camera to which an electronic device according to an aspect of the invention is applied.

FIG. 6 is a perspective view of a digital still camera to which an electronic device according to an aspect of the invention is applied. Interfaces with external devices are also briefly illustrated.

While commonly-used cameras expose a silver film to an optical image of a subject, a digital still camera 1300 photoelectrically converts an optical image of a subject into imaging signals (image signals) through an imaging element such as a charge-coupled device (CCD).

The digital still camera 1300 includes a display on the back side of a case (body) 1302 to display an image based on the imaging signal of the CCD. The display functions as a viewfinder for displaying an electronic image of the subject.

The display corresponds to the display system 100 described above.

A circuit board 1308 is placed within the case 1302. The circuit board 1308 includes a memory for storing (memorizing) imaging signals.

The digital still camera 1300 also includes a light-receiving unit 1304 at the front side (the back side of the drawing) of the case 1302. The light-receiving unit 1304 includes an optical lens (an imaging optical system) and a CCD.

When a photographer visually identifies a subject image on the display and presses a shutter 1306, imaging signals of the CCD are transferred to and stored in the memory disposed on the circuit board 1308.

The digital still camera 1300 also includes video signal output terminals 1312 and a data communication input-output terminal 1314 on the side surface of the case 1302. The video signal output terminals 1312 can be connected to a monitor 1430, and the data communication input-output terminal 1314 can be connected to a personal computer 1440. Imaging signals stored in the memory on the circuit board 1308 can be output to the monitor 1430 or the personal computer 1440 according to predetermined procedures.

In addition to the personal computer (a mobile personal computer), the mobile phone, and the digital still camera illustrated in FIGS. 4 to 6, an electronic device according to an aspect of the invention can be applied to television sets, video cameras, viewfinder and direct-view video tape recorders, laptop personal computers, car navigation systems, pagers, electronic organizers (with and without communication capabilities), electronic dictionaries, electronic calculators, electronic game machines, word processors, workstations, videophones, security monitors, electronic binoculars, POS terminals, touch panel-equipped devices (for example, automated-teller machines in financial institutions and ticket vending machines), medical equipment (for example, electronic thermometers, sphygmomanometers, blood glucose meters, electrocardiograph monitors, ultrasonographs, and endoscopic monitors), fishfinders, a variety of measuring instruments, instruments (for example, instruments for vehicles, aircrafts, and ships), flight simulators, various other monitors, and projection displays such as projectors.

While embodiments of a light-emitting element, a light-emitting apparatus, a display apparatus, and an electronic device according to the invention have been described with reference to the drawings, the invention is not limited to these embodiments.

EXAMPLES

The invention will be more clearly understood with reference to the following examples.

1. Fabrication of Light-Emitting Element

Example 1

(1) First, a transparent glass substrate having an average thickness of 0.5 mm was prepared. An ITO electrode (anode) having an average thickness of 100 nm was formed on the substrate by sputtering.

The substrate was immersed in acetone and then in 2-propanol and was subjected to ultrasonic cleaning and subsequent oxygen plasma treatment.

(2) A compound having the formula 7 was deposited on the ITO electrode by vacuum evaporation to form a hole-injection layer having an average thickness of 50 nm.

(3) A compound having the formula 16 (a first material) was deposited on the hole-injection layer by vacuum evaporation to form a hole-transport layer having an average thickness of 20 nm.

(4) The material for a red-light-emitting layer was deposited on the hole-transport layer by vacuum evaporation to form a red-light-emitting layer (a first light-emitting layer) having an average thickness of 10 nm. The material for a red-light-emitting layer contained a compound having the formula 17 (a dibenzo$\{[f,f']$-4,4',7,7'-tetraphenyl$\}$diindeno$\{1,2,3$-cd:$1',2',3'$-lm$\}$perylene derivative) as a red-light-emitting material (a guest material, RD), a compound having the formula 18 (a naphthacene derivative) as a host material (RH), and the compound having the formula 16 as the first material. The content (concentration) of the light-emitting material (dopant) in the red-light-emitting layer was 1.0% by weight. The content of the first material in the red-light-emitting layer was 15% by weight.

(5) The material for an intermediate layer was deposited on the red-light-emitting layer by vacuum evaporation to form an intermediate layer having an average thickness of 15 nm.

The material for an intermediate layer contained the compound having the formula 16 (a benzidine derivative) as the first material and a compound having the formula 20 (an anthracene derivative) as the second material (a mixture of these compounds was used). The contents of the first and second materials in the intermediate layer were 60% by weight and 40% by weight, respectively.

(6) The material for a blue-light-emitting layer was deposited on the intermediate layer by vacuum evaporation to form a blue-light-emitting layer (a second light-emitting layer) having an average thickness of 15 nm. The material for a blue-light-emitting layer contained a compound having the formula 31 as a blue-light-emitting material (a guest material, BD) and the compound having the formula 20 (a second material) as a host material. The content (concentration) of the blue-light-emitting material (dopant) in the blue-light-emitting layer was 10.0% by weight.

(7) The material for a green-light-emitting layer was deposited on the blue-light-emitting layer by vacuum evaporation to form a green-light-emitting layer (a third light-emitting layer) having an average thickness of 15 nm. The material for a green-light-emitting layer contained a quinacridone derivative having the formula 32 as a green-light-emitting material (a guest material, GD) and the compound having the formula 20 (a second material) as a host material. The content (concentration) of the green-light-emitting material (dopant) in the green-light-emitting layer was 2.0% by weight.

(8) $Alq_3$ having the formula 33 was deposited on the green-light-emitting layer by vacuum evaporation to form an electron-transfer layer having an average thickness of 5 nm.

(9) Lithium fluoride (LiF) was deposited on the electron-transfer layer by vacuum evaporation to form an electron-injection layer having an average thickness of 1 nm.

(10) Al was deposited on the electron-injection layer by vacuum evaporation to form an Al cathode having an average thickness of 100 nm.

(11) A glass protective cover (a sealing member) was placed on these layers and was sealed with an epoxy resin.

A light-emitting element as illustrated in FIG. 1 was fabricated through these processes.

Comparative Example 1

A light-emitting element was fabricated in the same way as in Example 1 expect that the material for the red-light-emitting layer was formed without using the compound having the formula 16 (the first material) and that the intermediate layer was formed only using the compound having the formula 16 (the benzidine derivative) (see Table 1).

TABLE 1

| | Red-light-emitting layer | | Intermediate layer | | Blue-light-emitting layer | | Green-light-emitting layer | |
|---|---|---|---|---|---|---|---|---|
| | Material | Thickness (nm) | Material | Thickness (nm) | Material | Thickness (nm) | Material | Thickness (nm) |
| Example 1 | RH RD HTL | 10 | HTL (1st material) BGH (2nd material) | 15 | BGH BD | 15 | BGH GD | 15 |
| Comparative Example 1 | RH RD | 10 | HTL | 15 | BGH BD | 15 | BGH GD | 15 |
| Comparative Example 2 | RH RD | 10 | HTL BGH | 15 | BGH BD | 15 | BGH GD | 15 |

Comparative Example 2

A light-emitting element was fabricated in the same way as in Example 1 expect that the material for the red-light-emitting layer was formed without using the compound having the formula 16 (the first material) (see Table 1).

2. Evaluation

The luminance and chromaticity of the light-emitting elements according to Example 1 and Comparative Examples 1 and 2 were measured at electric current densities of 10, 1, 0.1, 0.01, and 0.001 mA/cm$^2$.

Figure 7:
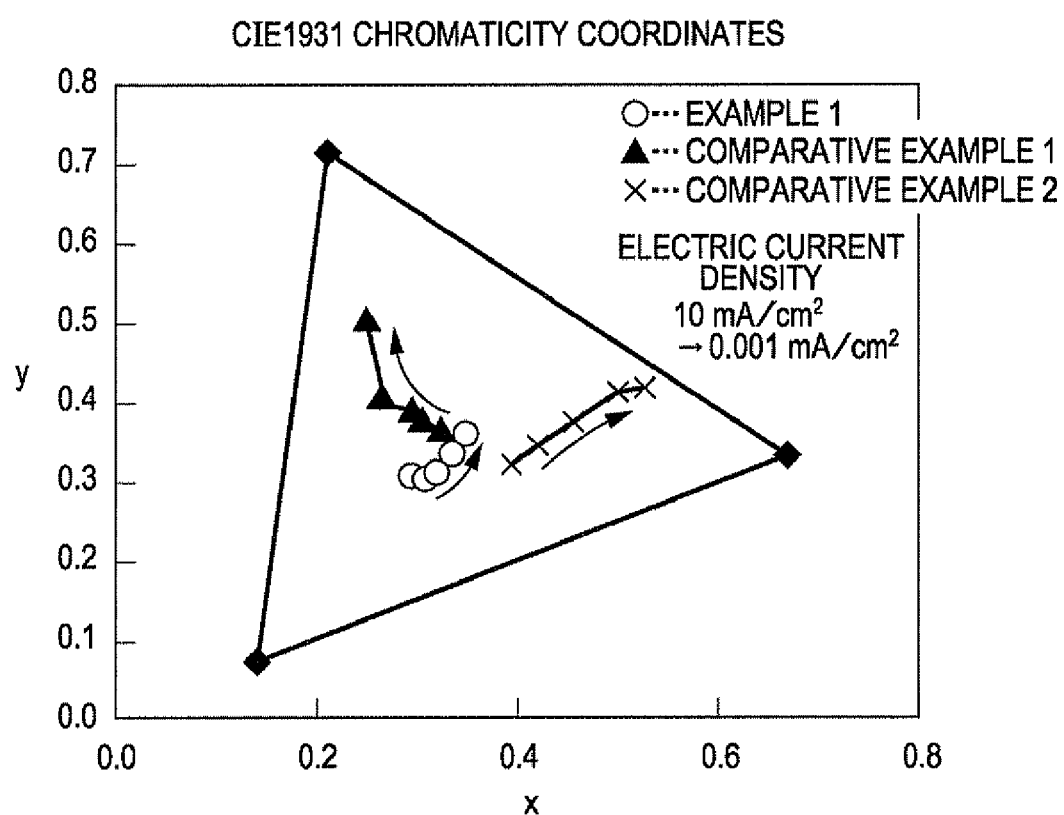
FIG. 7 is a graph (CIE1931 chromaticity coordinates) of the emission chromaticity of light-emitting elements according to an example and comparative examples as a function of electric current.

Table 2 and FIG. 7 show the results.

TABLE 2

| | Current density 10 mA/cm$^2$ | | | Current density 1 mA/cm$^2$ | | | Current density 0.1 mA/cm$^2$ | | | Current density 0.01 mA/cm$^2$ | | | Current density 0.001 mA/cm$^2$ | | |
|---|---|---|---|---|---|---|---|---|---|---|---|---|---|---|---|
| | Lumi-nance | Chromaticity x | y | Lumi-nance | Chromaticity x | y | Lumi-nance | Chromaticity x | y | Lumi-nance | Chromaticity x | y | Lumi-nance | Chromaticity x | y |
| Example 1 | 415 | 0.310 | 0.310 | 38 | 0.320 | 0.310 | 3.58 | 0.325 | 0.320 | 0.23 | 0.335 | 0.340 | 0.01 | 0.350 | 0.360 |
| Comparative Example 1 | 415 | 0.330 | 0.360 | 38 | 0.310 | 0.370 | 3.58 | 0.300 | 0.385 | 0.23 | 0.270 | 0.400 | 0.01 | 0.250 | 0.500 |
| Comparative Example 2 | 415 | 0.395 | 0.320 | 38 | 0.420 | 0.345 | 3.58 | 0.456 | 0.372 | 0.23 | 0.500 | 0.411 | 0.01 | 0.527 | 0.414 |

Table 2 and FIG. 7 show that the light-emitting element according to Example 1 emitted white light at all the electric current densities and did not exhibit significant variations in chromaticity. In particular, the light-emitting element according to Example 1 emitted white light at very low electric current densities.

In contrast, the light-emitting element according to Comparative Examples 1 and 2 emitted white light at high electric current densities, but could not emit white light at low electric current densities because of variations in chromaticity.

The entire disclosure of Japanese Patent Application No. 2009-077818, filed Mar. 26, 2009 is expressly incorporated by reference herein.

What is claimed is:

1. A light-emitting element comprising:
    a cathode;
    an anode;
    a red-light-emitting layer that is disposed between the cathode and the anode and emits red light;
    a blue-light-emitting layer that is disposed between the red-light-emitting layer and the cathode and emits blue light;
    a green-light-emitting layer that is disposed between the blue-light-emitting layer and the cathode and emits green light; and
    an intermediate layer that is disposed between and in contact with the red-light-emitting layer and the blue-light-emitting layer and functions so as to control the transfer of positive holes and electrons between the red-light-emitting layer and the blue-light-emitting layer,
    wherein the intermediate layer contains a first material and a second material different from the first material,
    the red-light-emitting layer contains the same material as the first material, and
    each of the blue-light-emitting layer and the green-light-emitting layer contains the same material as the second material.

2. The light-emitting element according to claim 1, wherein the first material is a benzidine derivative, and the second material is an anthracene derivative.

3. The light-emitting element according to claim 1, wherein the red-light-emitting layer contains a guest material and a host material to which the guest material is added, the guest material being a red-light-emitting material that emits red light, and the first material is different from the guest material and the host material of the red-light-emitting layer.

4. The light-emitting element according to claim 3, wherein the guest material of the red-light-emitting layer is a dibenzo{[f,f']-4,4',7,7'-tetraphenyl}diindeno{1,2,3-cd: 1',2',3'-lm}perylene derivative, and the host material of the red-light-emitting layer is a tetracene derivative.

5. The light-emitting element according to claim 1, wherein the blue-light-emitting layer contains a guest material and a host material to which the guest material is added, the guest material being a blue-light-emitting material that emits blue light, and the second material is the same material as the host material of the blue-light-emitting layer.

6. The light-emitting element according to claim 1, wherein the green-light-emitting layer contains a guest material and a host material to which the guest material is added, the guest material being a green-light-emitting material that emits green light, and the second material is the same material as the host material of the green-light-emitting layer.

7. The light-emitting element according to claim 1, further comprising a hole-transport layer having a hole-transport ability, the hole-transport layer being in contact with a surface of the red-light-emitting layer opposite the intermediate layer, wherein the hole-transport layer contains the same material as the first material.

8. The light-emitting element according to claim 1, wherein the intermediate layer is mainly formed of a mixture of the first material and the second material.

9. The light-emitting element according to claim 1, wherein the intermediate layer includes a first sublayer and a second sublayer, the first sublayer being in contact with the red-light-emitting layer and mainly formed of the first material, the second sublayer being disposed between and in contact with the first sublayer and the blue-light-emitting layer and mainly formed of the second material.

10. A light-emitting apparatus comprising a light-emitting element according to claim 1.

11. A display apparatus comprising a light-emitting element according to claim 1.

12. An electronic device comprising a display apparatus according to claim 11.

* * * * *